United States Patent [19]
Saito et al.

[11] 4,101,970
[45] Jul. 18, 1978

[54] MAGNETIC BUBBLE MODULE

[75] Inventors: Nobuo Saito, Mitaka; Shigeru Yoshizawa, Tokorozawa; Takashi Toyooka, Tokyo, all of Japan

[73] Assignee: President of Kogyo Gijutsuin, Japan

[21] Appl. No.: 703,604

[22] Filed: Jul. 8, 1976

[30] Foreign Application Priority Data
Jul. 8, 1975 [JP] Japan .................. 50-83092

[51] Int. Cl.$^2$ ............................................. G11C 19/08
[52] U.S. Cl. ..................................................... 365/2
[58] Field of Search ................ 340/174 TF, 174 SC; 365/2

[56] References Cited
U.S. PATENT DOCUMENTS
3,927,397  12/1975  Chow et al. .................. 340/174 TF OTHER PUBLICATIONS
IEEE Transactions on Magnetics–vol. Mag. 9, No. 3, Sep. 1973, pp. 429–433, 436–440.

Primary Examiner—James W. Moffitt
Attorney, Agent, or Firm—Craig & Antonelli

[57] ABSTRACT

In a magnetic bubble module comprising magnetic bubble chips disposed on substrates and driving coils surrounding the magnetic bubble chips, at least one of the substrates extends from the inside to the outside of the coils and serves as a heat transfer plate. The heat transfer plate includes at least one metal foil having a thickness smaller than a skin depth of the metal.

7 Claims, 8 Drawing Figures

|← 1cm →|

MAGNETIC BUBBLE MODULE

BACKGROUND OF THE INVENTION

1. Field of the Invention

This invention relates to a magnetic bubble module and more particularly to a substrate provided in the module, for supporting magnetic bubble chips.

2. Description of the Prior Art

In a conventional magnetic bubble module, a thin film of, for example, polyimide is attached onto a substrate of, for example, bakelite and a plurality of magnetic bubble chips are arranged on the thin film of polyimide to form a chip plane. Such a plane or a plurality of such planes are housed in the casing-shaped structure of an X-direction and a Y-direction driving coils for generating a rotating magnetic field. The coil structure is surrounded by the frame of permanent magnets and yoke plates for creating a bias magnetic field.

With this configuration, the heat generated by the coils is dissipated through the upper and lower yokes and a heat sink of, for example, aluminum, but the part of heat generated by the internally disposed coil cannot be effectively dissipated. Consequently, the temperature of the magnetic bubble chips reaches 25° C and above even when air-cooling is applied. If the ambient temperature around the magnetic bubble module is higher than 40° C, it is impossible for the magnetic bubble chips to perform a stable memory operation. If heat is radiated by means of blast through the module, the module must include a superfluous space for blast ducts. Accordingly, the sizes of the coils must be increased and the power for driving them must also be increased.

Another method for dissipating heat is to use the thermal conduction phenomenon. In general, however, a material having a good thermal conductivity has also a good electrical conductivity and if a material having a good electrical conductivity is placed in a high-frequency coil, eddy current is induced in the material so the Q-value of the coil is reduced and the magnetic field within the coil is also disturbed. Consequently, this method is not practically used.

SUMMARY OF THE INVENTION

The object of this invention is to provide a magnetic bubble module having a small size, which can be driven by a small power and especially a magnetic bubble module furnished with a heat transfer means which can effectively dissipate the heat generated by the coils without reducing the Q-value of the coils.

According to this invention, which has been made to attain the above object, the magnetic bubble module comprising magnetic bubble chips disposed on substrates and driving coils enclosing the chips, is characterised in that at least one of the substrates extends from the inside to the outside of the coils so as to serve as a heat transfer plate and that the heat transfer plate includes at least one metal foil having a thickness smaller than a depth to which the skin effect penetrates the metal.

When such a metal foil is placed in an h-f magnetic field, heat is generated in the metal foil. However, if a conductive material placed in the h-f magnetic field is so constructed as to prevent the eddy currents from being induced therein by the h-f magnetic field, the generation of heat can be limited to a minimum amount. In the case of a magnetic bubble module, the alternating magnetic fields capable of producing eddy currents is the rotating magnetic field applied parallel to the substrates on which the magnetic bubble chips are disposed, and if the substrates consist of thin foils which are made of a very conductive metal such as copper and cut in planes parallel to the plane of rotation of the rotating magnetic field, then the eddy current in the foils can be reduced to a minimum. Heat flow is not prevented by the cutting since it spreads along the planes. Namely, if the thickness of each foil is reduced while, keeping the total thickness constant, the power loss due to the eddy current can be decreased while the capacity for dissipating heat is kept constant. The inventors have proved that a greater amount of heat than that generated can be dissipated with this structure.

The criterion for the thickness of the cutting, i.e. thickness of the foil, is given by the skin depth $\delta$ such that $$\delta = \sqrt{\frac{1}{\omega\mu\sigma}}$$

where $\omega$ is the angular frequency, $\mu$ the magnetic permeability and $\sigma$ the electric conductivity. If the thickness of the foil is sufficiently larger than the skin depth, the alternating field is disturbed by the eddy currents in the surface of the conductor. If, on the other hand, the thickness of the foil is sufficiently smaller than the skin depth, the magnetic field penetrates the conductor so that the eddy currents and the power loss decrease while the alternating magnetic field is not disturbed.

This invention will be described below in detail by way of embodiment, but the examples described herein will by no means limit this invention to them. It should be noted that various modifications and improved versions within the scope of this invention are also possible.

BRIEF DESCRIPTION OF THE DRAWING

The same reference numerals are applied to like parts or elements throughout the figures.

DESCRIPTION OF THE PREFERRED EMBODIMENT

Figure 1:
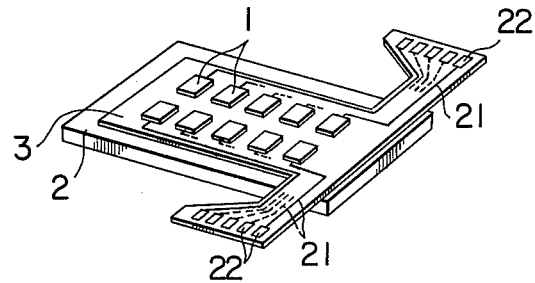
FIG. 1 is a perspective view of a conventional plane.
Figure 2:
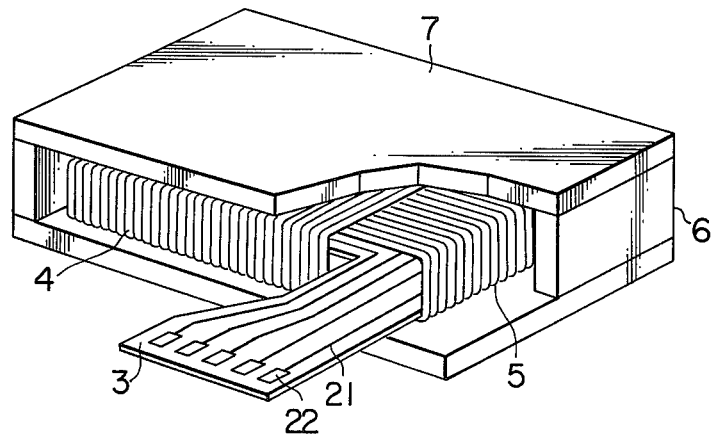
FIG. 2 is a perspective view of a magnetic bubble module, with a part thereof cut away, using the conventional plane shown in FIG. 1.

For better understanding of this invention, a conventional device will first be described with the aid of FIGS. 1 to 3. FIG. 1 shows a conventional plane supporting thereon magnetic bubble chips. In FIG. 1, reference numeral 2 indicates a substrate made of, for example, bakelite and a thin film 3, referred to usually as a flexible printed circuit, formed of, for example, polyimide and provided with predetermined wiring patterns is attached onto the substrate 2. A plurality of magnetic bubble chips 1 are arranged on the thin film 3. Desired signals are applied to and derived from the magnetic bubble chips 1 through lead wires 21 and terminals 22 connected electrically with the chips 1. As shown in FIG. 2, the plane shown in FIG. 1 is enclosed by coils 4 and 5 for generating a rotating magnetic field and the coils 4 and 5 are surrounded by permanent magnets 6 and yoke plates 7 for applying a bias magnetic field.

Figure 3:
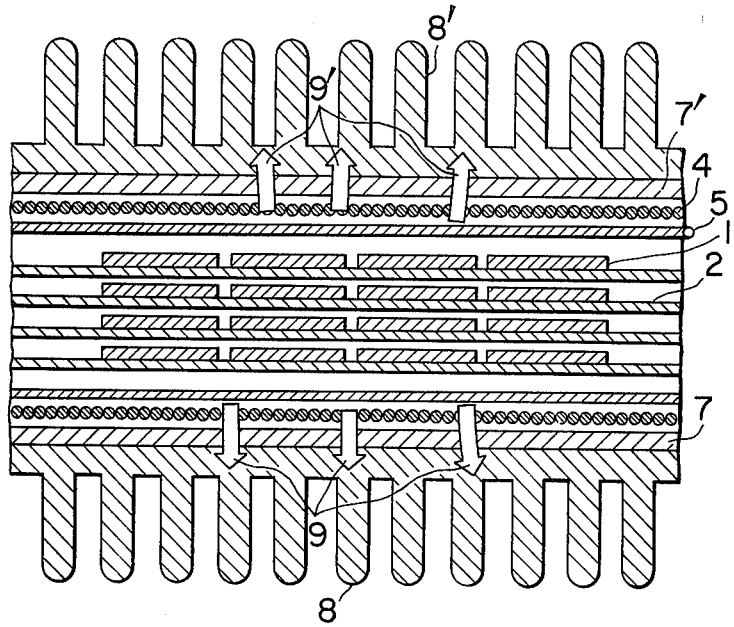
FIG. 3 shows in cross section how heat is transferred in the magnetic bubble module shown in FIG. 2.
Figure 4:
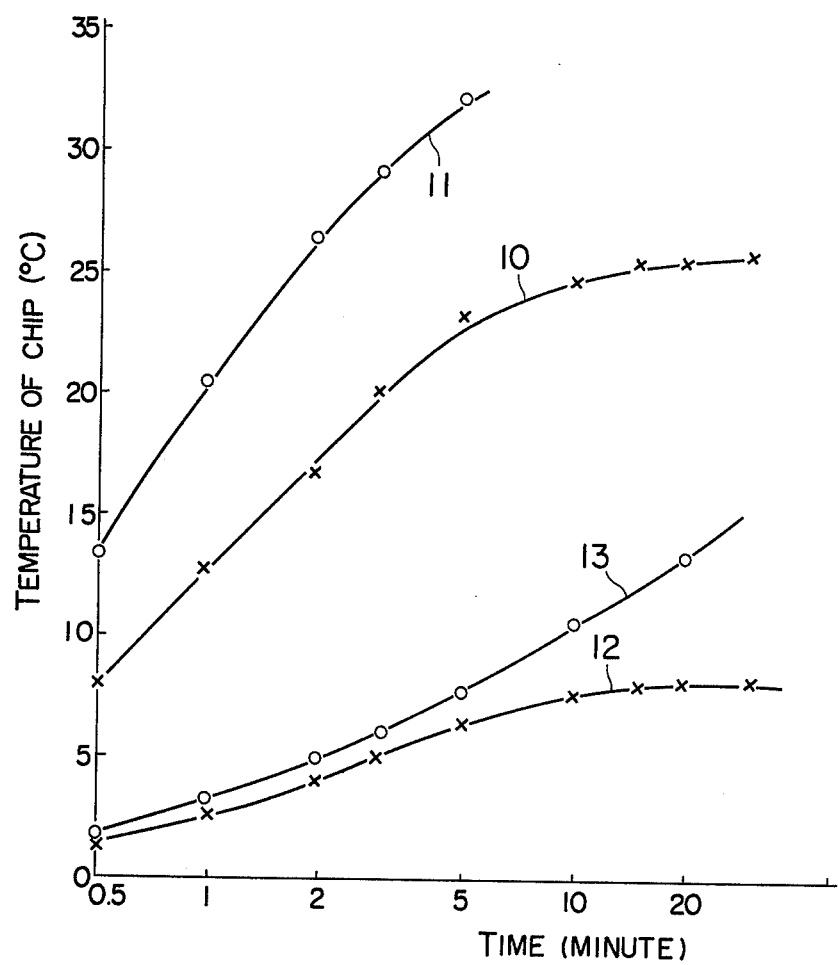
FIG. 4 comparatively shows in graphic representation the temperature rises in the magnetic bubble chips of the conventional magnetic bubble module and of the magnetic bubble module according to this invention.

FIG. 3 shows in partial cross section a conventional magnetic bubble module having 4 planes, each carrying 16 magnetic bubble chips, each chip being of dimensions 6.4 mm × 5.8 mm × 0.4 mm. Namely, the module has 64 chips. In FIG. 3, the direction of the heat dissipation in the conventional device will be described. Upper and lower yoke plates 7 and 7' are provided with heat sinks 8 and 8' of, for example, aluminum. With this structure, the heat generated in the magnetic bubble module is transferred, as indicated by arrows 9 and 9' through the coils and the yoke plates 7 and 7' to the heat sinks 8 and 8' and dissipated from them. In this case, however, the heat generated by the inner driving coil 5 cannot be effectively transferred outward so that the temperature rise in the chips becomes rather great. For example, the curves 10 and 11 in FIG. 4 show the variation in the temperature rise of a chip with time when a rotating magnetic field of 40 Oe is being generated by energizing the coils for generating the rotating magnetic field, the curve 10 corresponding to the case where the module is subjected to air-cooling using blast of 5m/sec and the curve 11 to the case where air-cooling with blast is not used.

Figure 5:
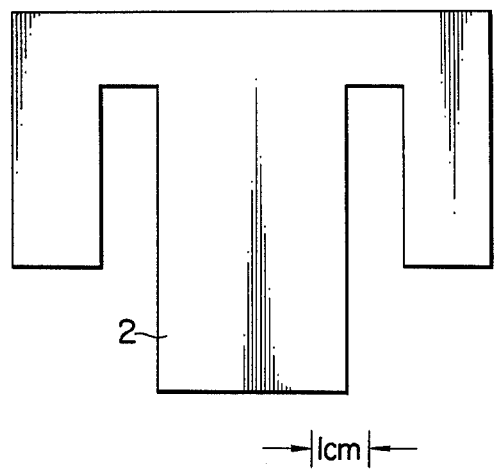
FIG. 5 is a plan view of a substrate as an embodiment of this invention.

In a magnetic bubble module as an embodiment of this invention, a substrate of a copper plate having such a shape as shown in FIG. 5 and a thickness of, for example, 0.3 mm, is used instead of the bakelite substrate shown in FIG. 1.

Figure 6:
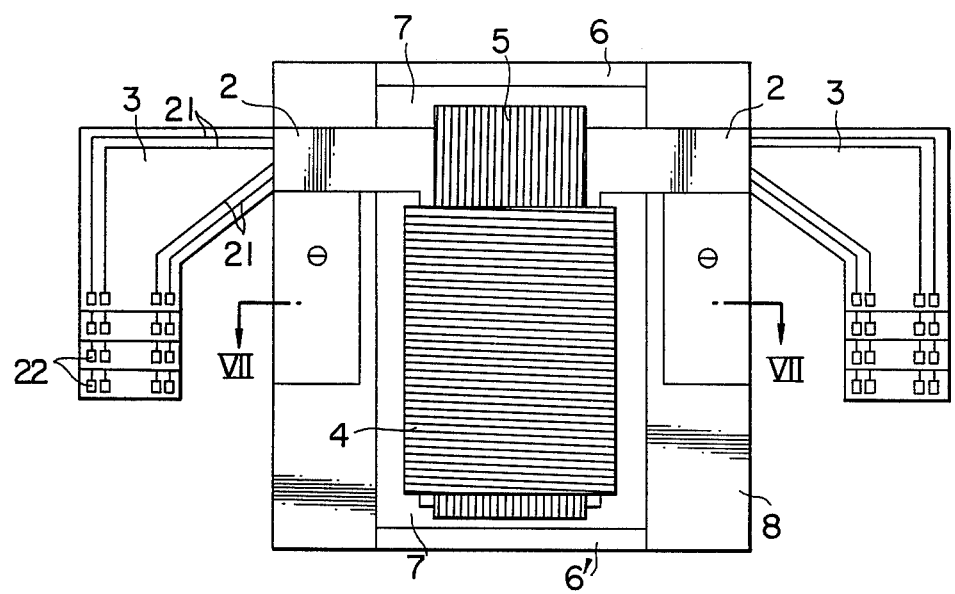
FIG. 6 is a plan view of a magnetic bubble module as an embodiment of this invention, using the substrate shown in FIG. 5, with its upper heat sink and upper yoke removed.
Figure 7:
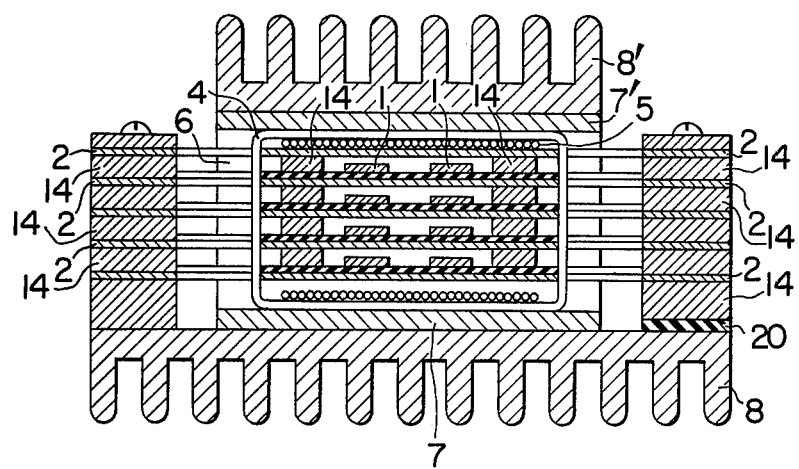
FIG. 7 is a cross section, on an enlarged scale, taken along lines VII—VII in FIG. 6.

FIG. 6 shows in plan an embodiment of this invention, i.e. a magnetic bubble module, and FIG. 7 shows in cross section the main part of the module. In this embodiment, four planes, each being a copper plate having such a shape as shown in FIG. 5, are stacked. As shown in FIGS. 6 and 7, parts of the substrate 2, i.e. copper plate, extend out of the coils 4 and 5 and the substrate 2 is in contact with the heat sink 8 in two places. In this case, the copper substrate is insulated in one of the two contact places from the heat sink by means of a thin insulating film 20 so as not to form a closed loop with the cooper plate and the heat sink. With this structure, if only one plane is used, the ac resistances ca. 2 Ω of the inner and the outer coils 5 and 4 with respect to an ac current of 100 KHz are respectively increased by 0.23 Ω and 0.19 Ω. Namely, the incremental amount of heat generated per copper substrate is about 10%. In this case, the temperature of the chip is 19° C with air-cooling and 30° C without air-cooling. These values are lower than the corresponding values attained by the conventional structure, indicated by the curves 10 and 11. This means that if a copper plate is inserted, the amount of heat generated indeed increases, but a larger amount than the increment of heat can be transferred out.

Figure 8:
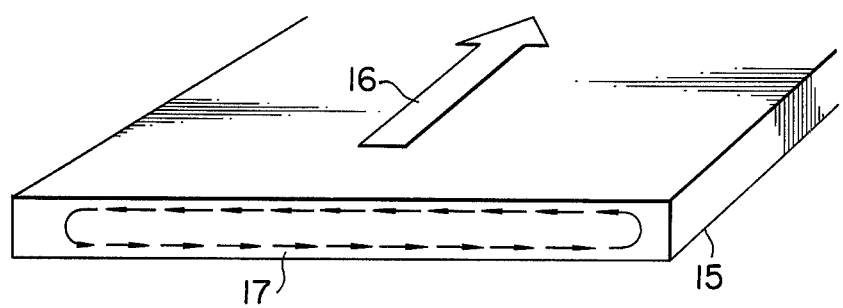
FIG. 8 shows in perspective view the eddy current induced in a copper plate in driving magnetic field.

With more copper substrates, the amount of heat generated in the copper plates and the amount of heat dissipated through the copper plates are both proportional to the number of the copper substrates. The increase in the number of the copper substrates is thus desirable in preventing the temperature rise of the chips, but too many copper substrates may disturb the rotating magnetic field within the coils since eddy current as shown in FIG. 8 is induced in each copper substrate. In FIG. 8, reference numerals 15, 16 and 17 respectively indicate a copper plate, an arrow indicating the direction of the rotating magnetic field and the path of eddy current.

Now, five copper foils insulated from one another and each having a thickness of 50 μm, are laminated to form a composite copper plate having a thickness of 0.3 mm and a shape as shown in FIG. 5. Since the skin depth of copper at 100 KHz is 0.2 mm, each copper foil is sufficiently thin so that there is little eddy current in the foil. In most laminated substrates, each component foil has a thickness equal to about ¼δ (half the skin depth). Four planes having such a laminated structure are stacked as shown in FIG. 7, with spacers 14 of the same material and structure interposed between the planes, and the assembly of the substrates, i.e. planes, and the spacers is mounted in the coils in such a manner that heat is dissipated also through the ends of the spacer. With this lamination structure, the eddy current can be prevented while the heat flow is not prevented since it is along the surface of each foil. As shown in FIG. 7 a combination of a spacer and a substrate carrying no chip thereon is mounted above the uppermost chips so that air warmed by the coils may not come in direct contact with the chips.

A magnetic bubble module having such a structure as described above was subjected to a performance test, in which the Q of the coils and the power consumed by the coils were measured while a rotating magnetic field of 40 Oe and 100 KHz was being applied to the chips. The result was as shown in the following tables 1 and 2.

Table I

|  | With substrate plates | Without substrate plates |
|---|---|---|
| Q of coil X | 5.6 | 16.6 |
| Q of coil Y | 7.7 | 15.4 |
| sum of powers consumed by two coils X and Y | 16.8 W | 4.5 W |

Table II

|  | With substrate plates | Without substrate plates |
|---|---|---|
| Q of coil X | 11.5 | 16.6 |
| Q of coil Y | 13.8 | 15.4 |
| sum of powers consumed by coils X and Y | 8.4 W | 4.5 W |

The table I corresponds to the case where a solid copper plate having a thickness of 0.3 mm is used as both substrate and spacer. The table II corresponds to the case where composite, laminated copper plates consisting of five copper foils each having a thickness of 50 μm, are used as both substrate and spacer. The change in the temperature rise of chips with time, in case of the laminated copper plates being used, is as shown in the curves 12 and 13 in FIG. 4. The curve 12 corresponds to the case where blast of 5 m/sec is used, indicating the temperature rise of about 8° C and the curve 13 to the case where no blast is used, indicating the temperature rise of about 15° C. It is thus seen that the temperature rises of chips in case of the laminated plate being used can be halved in comparison with the values of 19° C and 30° C attained in the previous example in which a solid copper plate having a thickness of 0.3 mm is used.

As described above, although the Q values of the coils are decreased and the powers consumed by them are increased, to a small extent, by using a solid copper plate or a composite, laminated copper plate as a substrate of a magnetic bubble module, the heat dissipation efficiency in this case can well compensate for the demerits of the small decrease in the Q values and the small increase in the consumed powers. The range of allowable ambient temperatures for a magnetic bubble module is restricted by the point of change in the characteristics of the magnetic bubble chips. Therefore, since the temperature rise of the chips in the module according to this invention is smaller by more than 10° C compared with that of the chips in the conventional magnetic bubble module, the magnetic bubble module embodying this invention can operate within a range of temperatures wider, by more than 10° C, than the range covered by the conventional module.

The plates for copper are used as substrates in the above embodiments, but it is clear that copper may be replaced by some other suitable metals without losing the effect of this invention.

We claim:

1. A magnetic bubble module comprising at least one substrate including therein at least one metal foil having a thickness smaller than a skin depth of said metal, said substrate serving also as a heat transfer plate; at least one magnetic bubble chip arranged on said substrate; and driving coils enclosing said chip therein for generating a rotating magnetic field, wherein said substrate extends from the inside to the outside of said coils.

2. A magnetic bubble module as claimed in claim 1, further comprising a heat sink disposed outside said driving coils, wherein a part of said substrate is thermally in contact with said heat sink outside said driving coils, an insulating film being inserted between said part of said substrate and said heat sink so that no closed circuit is formed.

3. A magnetic bubble module as claimed in claim 2, wherein said substrate has a lamination structure consisting of alternate metal and insulator thin films.

4. A magnetic bubble module as claimed in claim 1, wherein said module comprises a plurality of said substrates, a spacer having the same structure as said substrate is inserted between said substrates, and said spacer also extends from the inside to the outside of said coils.

5. A magnetic bubble module as claimed in claim 1, wherein said substrate has a lamination structure consisting of alternate metal and insulator thin films.

6. A magnetic bubble module as claimed in claim 1, wherein said substrate comprises a plate of said metal.

7. A magnetic bubble module as claimed in claim 1, wherein said substrate comprises a lamination of a plurality of said metal foils.

* * * * *